US012610478B2

(12) United States Patent
Guo et al.

(10) Patent No.: US 12,610,478 B2
(45) Date of Patent: Apr. 21, 2026

(54) SUB-DISPLAY PANEL ASSEMBLY AND TILED DISPLAY APPARATUS

(71) Applicants:BOE MLED Technology Co., Ltd., Beijing (CN); BOE TECHNOLOGY GROUP CO., LTD., Beijing (CN)

(72) Inventors: Shaofei Guo, Beijing (CN); Shipeng Wang, Beijing (CN); Chao Tian, Beijing (CN); Jianfeng Wang, Beijing (CN); Jiaxing Yuan, Beijing (CN); Jianbai Tan, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 104 days.

(21) Appl. No.: 18/290,782

(22) PCT Filed: Aug. 30, 2022

(86) PCT No.: PCT/CN2022/115801
§ 371 (c)(1),
(2) Date: Jan. 21, 2024

(87) PCT Pub. No.: WO2024/044959
PCT Pub. Date: Mar. 7, 2024

(65) Prior Publication Data
US 2025/0098081 A1     Mar. 20, 2025

(51) Int. Cl.
*H05K 5/02* (2006.01)
*H05K 5/00* (2006.01)
*H05K 5/30* (2025.01)

(52) U.S. Cl.
CPC ......... *H05K 5/0217* (2013.01); *H05K 5/0052* (2013.01); *H05K 5/30* (2025.01)

(58) Field of Classification Search
CPC ...... H05K 5/0217; H05K 5/0052; H05K 5/30; G02F 1/13452; G02F 1/1333
See application file for complete search history.

(56) References Cited

U.S. PATENT DOCUMENTS

| | | | |
|---|---|---|---|
| 7,583,516 B2 * | 9/2009 | Lu .......................... | H05K 7/142 |
| | | | 361/807 |
| 2014/0120745 A1 * | 5/2014 | Wang .................... | G06F 1/1632 |
| | | | 439/39 |

(Continued)

FOREIGN PATENT DOCUMENTS

| | | |
|---|---|---|
| CN | 105810107 A | 7/2016 |
| CN | 107255876 A | 10/2017 |

(Continued)

OTHER PUBLICATIONS

Machine translation of CN 215643475 (Year: 2025).*
China Patent Office, First Office Action, Oct. 13, 2025, for corresponding CN application No. 202280002912.5.

*Primary Examiner* — Sagar Shrestha
(74) *Attorney, Agent, or Firm* — HOUTTEMAN LAW LLC

(57) ABSTRACT

The present disclosure provides a sub-display panel assembly, including: a display substrate; a frame, including: a bottom plate having a support surface and a mounting surface arranged opposite to each other, where the support surface is configured to bear the display substrate; and a first circuit board on a side of the bottom plate away from of display substrate, including: a first circuit board body connected to the mounting surface of the bottom plate through an elastic component, where the elastic component is configured to support the first circuit board body and enable the first circuit board body to move relative to the bottom plate. An embodiment of the present disclosure further provides a tiled display apparatus.

20 Claims, 6 Drawing Sheets

(56)         References Cited

U.S. PATENT DOCUMENTS

| 2020/0375039 A1* | 11/2020 | Mudd | H05K 5/0204 |
| 2022/0322547 A1* | 10/2022 | Wang | G06F 1/1652 |

FOREIGN PATENT DOCUMENTS

| CN | 108370650 | A | 8/2018 |
| CN | 109210400 | A | 1/2019 |
| CN | 109473797 | A | 3/2019 |
| CN | 109935167 | A | 6/2019 |
| CN | 210838281 | U | 6/2020 |
| CN | 212571529 | U | 2/2021 |
| CN | 112492147 | A | 3/2021 |
| CN | 213342866 | U | 6/2021 |
| CN | 215643475 | U | 1/2022 |
| CN | 215933087 | U | 3/2022 |
| CN | 216525924 | U | 5/2022 |
| CN | 115376417 | A | 11/2022 |
| TW | 201431194 | A | 8/2014 |

* cited by examiner

SUB-DISPLAY PANEL ASSEMBLY AND TILED DISPLAY APPARATUS

TECHNICAL FIELD

The present disclosure relates to the field of display technology, and particularly relates to a sub-display panel assembly and a tiled display apparatus.

BACKGROUND

A large display screen is typically formed by tiling a plurality of sub-display panel assemblies which arranged in array, and display images of the sub-display panel assemblies are combined into a complete image on the large display screen. A sub-display panel assembly generally includes a display substrate, a frame, and first circuit board, where the frame is configured to support and fix the display substrate, and the first circuit board may be connected to the display substrate via a FPC.

When a plurality of sub-display panel assemblies are fixed to a bearing box to be used as a tiled display apparatus, a first circuit board in each of the sub-display panel assemblies has to be aligned and connectively assembled with a second circuit board on the bearing box, and a plurality of first connection terminals of a first connector on the first circuit board are enabled to contact a plurality of second connection terminals of a second connector on the second circuit board, and so that the second circuit board is ensured to provide a working voltage and a display signal for the first circuit board, and the first circuit board transmits the received working voltage and display signal to the display substrate via a FPC, so as to enable the display substrate to display an image.

SUMMARY

In a first aspect, an embodiment of the present disclosure provides a sub-display panel assembly, including:

a display substrate;

a frame, including a bottom plate, wherein the bottom plate has a support surface and a mounting surface arranged opposite to each other, wherein the support surface is configured to bear the display substrate; and a first circuit board on a side of the bottom plate away from of display substrate, the first circuit board includes a first circuit board body, wherein the first circuit board body is connected to the mounting surface of the bottom plate through an elastic component, wherein the elastic component is configured to support the first circuit board body and enable the first circuit board body to move relative to the bottom plate.

In some embodiments, the first circuit board body is provided with at least one first hole, and the frame is provided with a corresponding second hole at a position opposite to the first hole;

the elastic component is provided in one-to-one correspondence with the first hole, and the elastic component includes: a location limited component, including a location limited member and a first connection member;

the location limited member is located on a side of the first circuit board body away from the display substrate, and the location limited member has a length in a second direction greater than the first hole, wherein the second direction is parallel to a plane where the mounting surface is located;

the first connection member passes through the first hole, one end of the first connection member is connected to the location limited member, and the other end of the first connection member extends into, and is connectively assembled with, the second hole;

the elastic component further includes: a first elastic member and/or a second elastic member, wherein the first elastic member is located between the location limited member and the first circuit board body, and the second elastic member is located between the bottom plate and the first circuit board body; and the first circuit board body is configured to be movable in a direction parallel to a normal direction of the bottom plate through the first elastic member and/or the second elastic member.

In some embodiments, a sectional area of the first hole parallel to the display substrate is larger than a sectional area of a portion of the first connection member in the first hole parallel to the display substrate.

In some embodiments, the elastic component includes a first elastic member, a first baffle is further provided between the first elastic member and the first circuit board, the first baffle has a length in a third direction greater than a corresponding first hole, and the first baffle is provided with a third hole having an aperture diameter smaller than the first hole;

and/or the elastic component includes a second elastic member, a second baffle is further provided between the second elastic member and the first circuit board, the second baffle has a length in a third direction greater than a corresponding first hole, and the second baffle is provided with a fourth hole having an aperture diameter smaller than the first hole; and the third direction is parallel to the plane where the mounting surface is located.

In some embodiments, the elastic component includes a first elastic member nested onto a periphery of the first connection member;

and/or the elastic component includes a second elastic member nested onto the periphery of the first connection member.

In some embodiments, the first elastic member includes a spring or a spring leaf; and the second elastic member includes a spring or a spring leaf.

In some embodiments, the second hole is a screw hole, the location limited component is a screw, the location limited member is a screw nut, the first connection member is a screw bolt, and external threads on the first connection member are matched with internal threads in the second hole.

In some embodiments, four first holes are provided and arranged at four corner positions of the first circuit board body, respectively.

In some embodiments, the first circuit board body is provided with a plurality of fifth holes, the fifth hole is in one-to-one correspondence with the elastic component, and the elastic component includes: a fixed component and a third elastic member; and the fixed component is fixed on the mounting surface, one end of the third elastic member is connected to a corresponding fifth hole, and the other end of the third elastic member is connected to the fixed component.

In some embodiments, the fixed component includes: a fixed member and a second connection member;

the fixed member is provided with a sixth hole and a seventh hole, the seventh hole is communicated to the sixth hole from one surface of the fixed member, and an extending direction of the seventh hole is intersected with an extending direction of the sixth hole;

the second connection member extends into the sixth hole through the seventh hole to be connected to the fixed member; and one end of the third elastic member, which is away from the first circuit board body, extends into a corresponding sixth hole and connects to the second connection member.

In some embodiments, the seventh hole is a screw hole, the second connection member is a screw, and internal threads in the seventh hole are matched with external threads on the second connection member.

In some embodiments, the fixed member is integrally formed with the bottom plate.

In some embodiments, four fifth holes are provided and arranged at four corner positions of the first circuit board body, respectively.

In some embodiments, the third elastic member includes a spring.

In some embodiments, the first circuit board further includes: a first connector on the mounting surface and configured to be assembled with a second connector on a bearing box;

a first connection terminal and a first magnetic attraction structure are provided on a side surface of the first connector away from the mounting surface, and a second connection terminal and a second magnetic attraction structure are provided on the second connector; and the first connector and the second connector are configured to: be magnetically attracted through the first magnetic attraction structure and the second magnetic attraction structure, so that the first connection terminal contacts the second connection terminal.

In some embodiments, a plurality of first connection terminals are provided on a side surface of the first connector away from the mounting surface, and the plurality of first connection terminals form a first connection terminal array; and two first magnetic attraction structures are provided and arranged on opposite sides of the first connection terminal array, respectively.

In some embodiments, the first circuit board further includes: a plurality of third connectors on the mounting surface and connected to the display substrate through the flexible circuit board.

In a second aspect, an embodiment of the present disclosure further provides a tiled display apparatus, including: a plurality of sub-display panel assemblies, wherein at least one of the sub-display panel assemblies is the sub-display panel assembly according to the first aspect.

In some embodiments, the tiled display apparatus further includes:

a bearing box configured to bear the plurality of the sub-display panel assemblies.

In some embodiments, the first circuit board further includes: a first connector on the mounting surface, wherein a first connection terminal and a first magnetic attraction structure are provided on a side surface of the first connector away from the mounting surface;

the bearing box is provided with a plurality of second circuit boards in one-to-one correspondence with the sub-display panel assemblies and a second connection terminal and a second magnetic attraction structure are provided on each second circuit board; and the first connector and the second connector are configured to: be magnetically attracted through the first magnetic attraction structure and the second magnetic attraction structure, so that the first connection terminal contacts a corresponding second connection terminal.

DETAIL DESCRIPTION OF EMBODIMENTS

Figure 1:
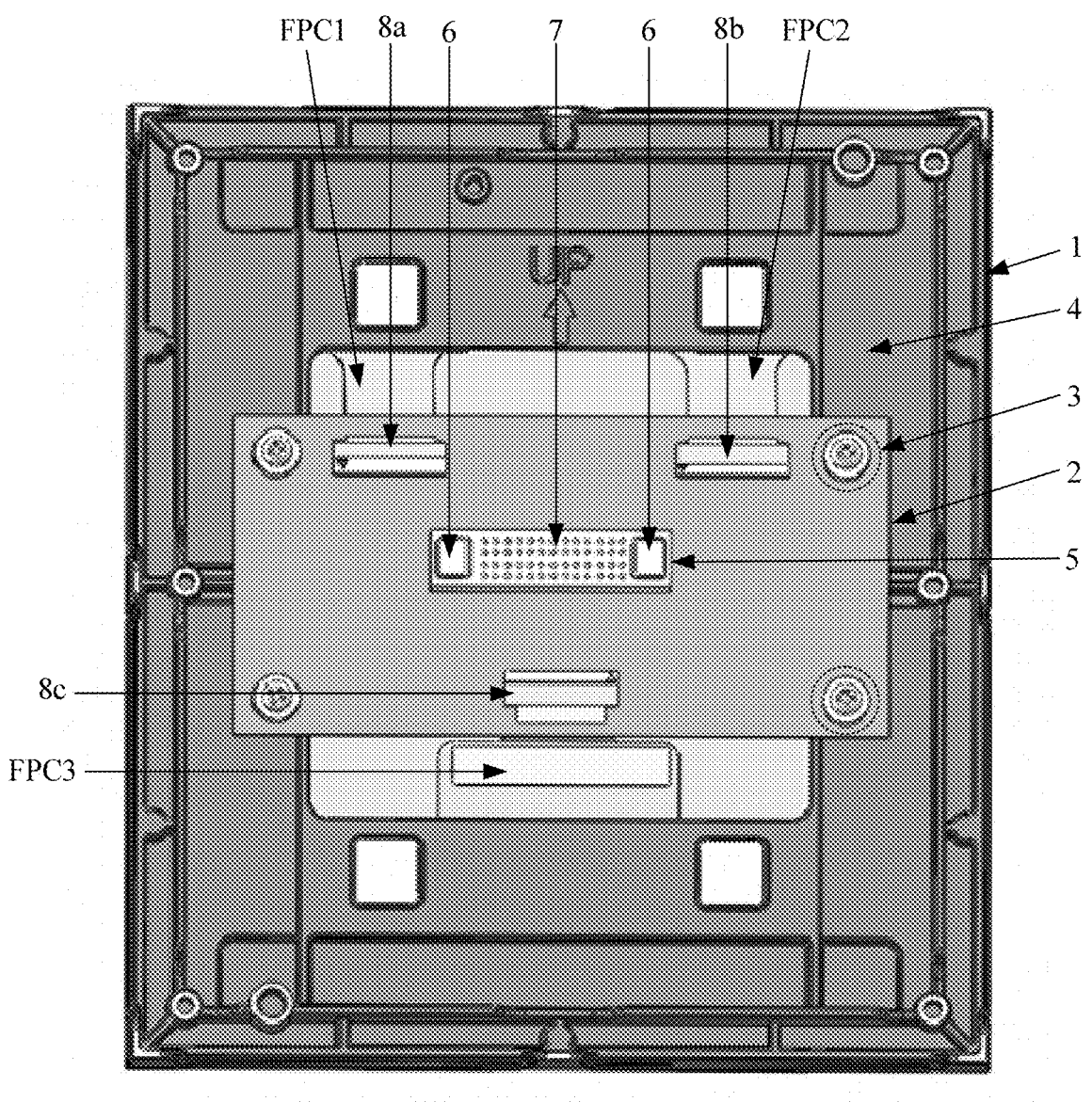
FIG. 1 is a schematic top view of a sub-display panel assembly according to an embodiment of the present disclosure.

To improve understanding of the technical solution of the present disclosure for those skilled in the art, the present disclosure will be described in detail below with reference to accompanying drawings and specific implementations.

The present disclosure will be described in detail below with reference to the accompanying drawings. Throughout the drawings, elements the same as or similar to each other are indicated by similar reference signs. For the sake of clarity, various parts in the figures are not all drawn to scale. Moreover, some well-known parts may not be shown in the figures.

For better understanding of the present disclosure, many specific details, such as structures, materials, dimensions, processing, and techniques of components, of the present disclosure are described below. However, the present disclosure may be implemented without these specific details, as will be understood by those skilled in the art.

The words "first", "second" and similar terms used in the embodiments of the present disclosure do not denote any order, quantity, or importance, but are used merely for distinguishing different components from each other. Likewise, the word "comprising" or "including" or the like means that the element or item preceding the word contains elements or items that appear after the word or equivalents thereof, but does not exclude other elements or items. The reference to two structures "connected" or "coupled" together or the like refer to not only the two structures connected by directly contacting each other, but also the two structures indirectly connected through other structures.

In addition, as used herein, the reference to two structures "fixed" together merely indicates that the two structures are not separable under a certain condition or at a certain moment, but may be separable under other conditions or at other moments. For example, a screw is fixed to a corresponding screw hole when the screw is screwed into the screw hole, but the screw may be unscrewed from the screw hole so that the screw is separated from the screw hole.

In addition, as used herein, a range defined as A to B includes both end values A and B.

In the relevant art, the first circuit board in the sub-display panel assembly is fixed to the frame by screws. When the fixing is completed, the first circuit board and the frame are not movable relative to each other. Specifically, some holes are formed in the first circuit board, and a plurality of screw holes in one-to-one correspondence with the holes in the first circuit board are formed on a back face of a bottom plate of the frame, and screws pass through the holes and the screw holes to complete screw joint and fixation, so that the first circuit board is fixedly assembled with the bottom plate.

When the sub-display panel assembly of the relevant art is assembled to the bearing box, due to an assembly tolerance, as the number of sub-display panel assemblies mounted on the bearing box increases, the misalignment between the sub-display panel assemblies and the bearing box also increases, making it difficult to align and connectively assemble the first connectors of the first circuit boards in the sub-display panel assemblies with the second connectors of the second circuit boards on the bearing box. For example, although the first connector of the first circuit board on the sub-display panel assembly can be placed directly opposite to the second connector of the second circuit board on the bearing box, there is a gap between the first connector of the first circuit board and the corresponding second connector of the second circuit board in a normal direction of the display substrate due to certain reasons. That is, first connection terminals on the first connector cannot be reliably electrically connected to second connection terminals on the second connector. For another example, due to an excessive accumulated assembly tolerance, the first connector of the first circuit board in the sub-display panel assembly cannot be aligned with the second connector of the corresponding second circuit board in any manner, and therefore, when the first connector of the first circuit board is connectively assembled to the second connector of the second circuit board, the first connection terminals on the first connector and the second connection terminals on the second connector are misaligned or even out of contact.

To effectively improve at least one of the problems in the relevant art, an embodiment of the present disclosure provides a sub-display panel assembly.

Figure 2:
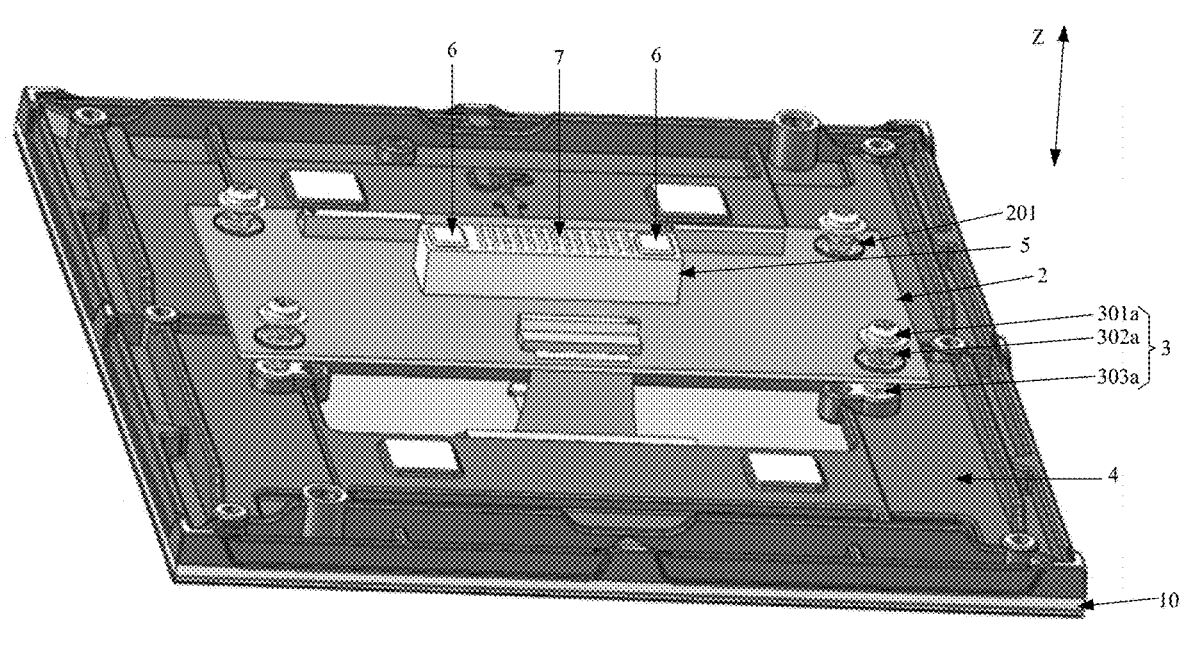
FIG. 2 is a schematic structural view of the sub-display panel assembly shown in FIG. 1.
Figure 3:
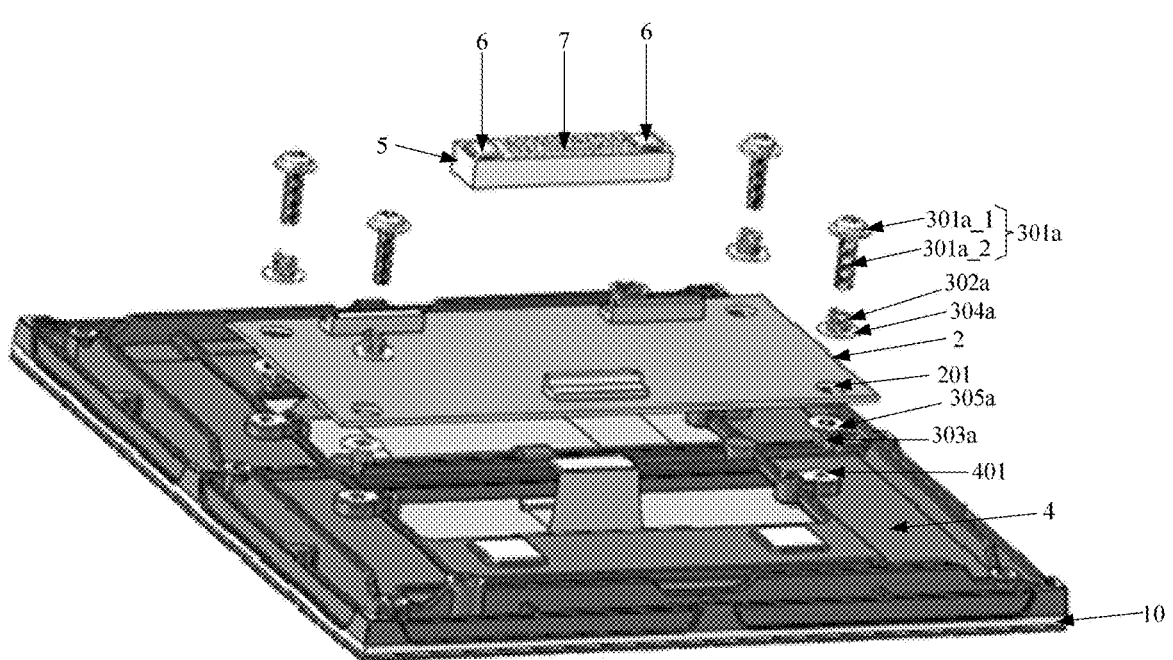
FIG. 3 is an exploded structural view of the sub-display panel shown in FIG. 1.
Figure 4:
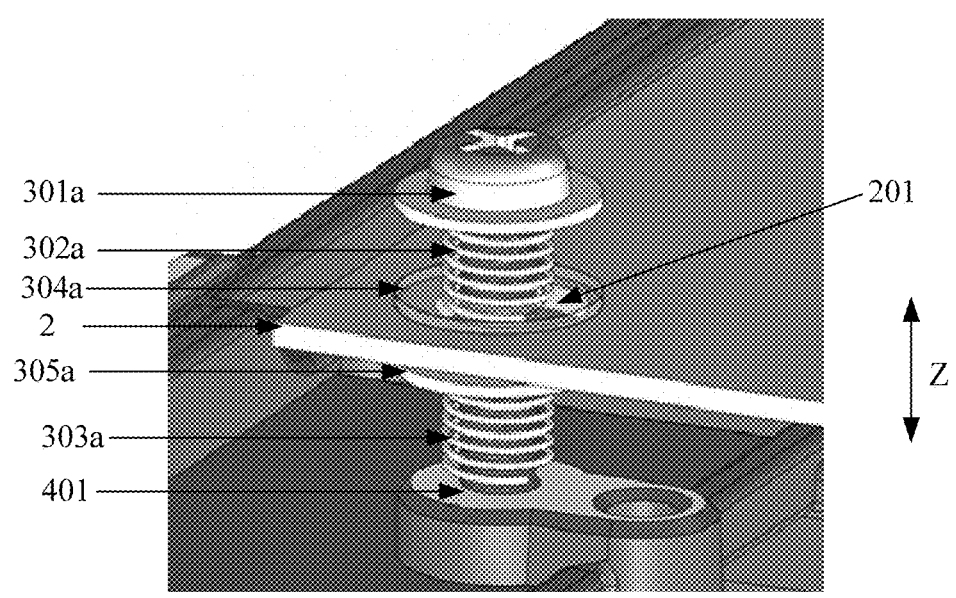
FIG. 4 is an enlarged structural view of FIG. 1 at an elastic component 3.

FIG. 1 is a schematic top view of a sub-display panel assembly according to an embodiment of the present disclosure. FIG. 2 is a schematic structural view of the sub-display panel assembly shown in FIG. 1. FIG. 3 is an exploded structural view of the sub-display panel shown in FIG. 1. FIG. 4 is an enlarged structural view of FIG. 1 at an elastic component 3. As shown in FIGS. 1 to 4, the sub-display panel assembly includes: a display substrate 10, a frame 1, and a first circuit board. The frame 1 includes: a bottom plate 4 having a support surface and a mounting surface arranged opposite to each other, where the support surface is configured to bear the display substrate 10. A first circuit board is located on a side of the bottom plate 4 away from of display substrate 10. The first circuit board includes: a first circuit board body 2 connected to the mounting surface of the bottom plate 4 through an elastic component

6

3. The elastic component 3 is configured to support the first circuit board body 2 and enable the first circuit board body 2 to move relative to the bottom plate 4.

In an embodiment of the present disclosure, when the sub-display panel assembly is aligned and connectively assembled with a bearing box, since the first circuit board body 2 is connected to the bottom plate 4 through the elastic component 3, a position of the first circuit board body 2 may be adjusted based on elastic deformation of the elastic component 3. In other words, the position of the first circuit board can be adjusted to a certain extent. When misalignment occurs between a first connector 5 on the first circuit board and a second connector 5' on the bearing box, or when the first connector 5 on the first circuit board cannot be connectively assembled to the second connector 5' on the bearing box due to a gap therebetween, the position of the first circuit board can be correspondingly adjusted to eliminate the misalignment or gap, thereby ensuring proper alignment and connective assembly of the first connector 5 of the first circuit board and the second connector 5' of the second circuit board.

In some embodiments, the display substrate 10 includes: a bearing substrate, a plurality of light-emitting elements, and at least one third connection member. The light-emitting elements are fixed on one side of the bearing substrate away from the bottom plate 4, and the third connection member is fixed on the other side of the bearing substrate close to the bottom plate 4. A position adjustment structure is provided and connected to the third connection member in one-to-one correspondence.

In an embodiment of the present disclosure, the bearing substrate may be an FR type printed circuit board composed of an insulation layer, a connection wiring layer, and a pad for assembling and soldering an electronic component (e.g., a light-emitting element, a driver element, a sensor element, etc.). The insulation layer and the connection wiring layer may have multiple layers, and connection wires in different layers may be connected by passing through a hole in the insulation layer. It will be appreciated that the bearing substrate may also be made of a material including glass, plastic, quartz, metal, or the like, and the bearing substrate is provided with a circuit and a pad, and the pad is used for mounting and soldering an electronic component (such as a light-emitting element, a mini LED or a micro LED).

The light-emitting element may be a micro LED or a mini LED which can be mounted on a first side (generally referred to as a front side) of the bearing substrate through a die bonding process. On a second side (generally referred to as a back side) of the bearing substrate, a circuit board (which may be electrically connected to the first circuit board via an FPC) is provided to supply an electrical signal to the light-emitting element on the first side.

In some embodiments, the first circuit board body 2 is provided with at least one first hole 201, and the frame 1 is provided with a corresponding second hole 401 at a position opposite to the first hole 201. The elastic component 3 is provided in one-to-one correspondence with the first hole 201. The elastic component 3 includes: a location limited component 301a including a location limited member 301a_1 and a first connection member 301a_2.

The location limited member 301a_1 is located on a side of the first circuit board body 2 away from the display substrate 10. The location limited member has a length in a second direction greater than that of the first hole 201. The second direction is parallel to a plane where the mounting surface is located (the second direction may be any direction parallel to the plane where the mounting surface is located).

Through the above arrangement, it can be ensured that the location limited member does not pass through the first hole 201.

The first connection member 301*a*_2 passes through the first hole 201. One end of the first connection member 301*a*_2 is connected to the location limited member 301*a*_1, and the other end of the first connection member 301*a*_2 extends into and is connectively assembled with the second hole 401. The elastic component 3 further includes: a first elastic member 302*a* and/or a second elastic member 303*a*. The first elastic member 302*a* is located between the location limited member 301*a*_1 and the first circuit board body 2, and the second elastic member 303*a* is located between the bottom plate 4 and the first circuit board body 2.

In the case shown in FIGS. 3 and 4, a case where the elastic component 3 includes both the first elastic member 302*a* and the second elastic member 303*a* is exemplarily depicted. With the first elastic member 302*a* and the second elastic member 303*a*, the first circuit board body 2 may be enabled to move in a normal direction (i.e., the direction Z in the figure) of the display substrate 10.

It should be noted that the above case of providing both the first elastic member 302*a* and the second elastic member 303*a* is a preferred implementation for the embodiment of the present disclosure, in which the first circuit board body 2 may be kept at a middle position of the first connection member 301*a*_2 of the location limited component 301*a* without any external force (referred to as an initial state). In other words, in the initial state, the first circuit board body 2 may be moved either in a direction approaching the display substrate 10 or in a direction away from the display substrate 10, so as to adapt to different application scenarios.

It should be known by those of ordinary skill in the art that in the embodiments of the present disclosure, it is possible to provide only the first elastic member 302*a* but not the second elastic member 303*a*, or only the second elastic member 303*a* but not the first elastic member 302*a*, either of which can also enable the first circuit board body 2 to move in the normal direction of the display substrate 10 and falls within the protection scope of the present disclosure.

In some embodiments, a sectional area of the first hole 201 parallel to the display substrate 10 is larger than a sectional area of a portion of the first connection member in the first hole 201 parallel to the display substrate 10. In other words, the first circuit board body 2 can be moved relative to the first connection member 301*a*_2 of the location limited component 301*a* in a direction parallel to a plane where the display substrate 10 is located. That is, the first circuit board body 2 can be moved relative to the display substrate 10 in a direction parallel to the plane where the display substrate 10 is located. With the above arrangement, the position of the first circuit board can be adjusted not only in the normal direction of the display substrate 10 (the Z direction shown in FIGS. 2 and 4), but also in the direction parallel to the plane where the display substrate 10 is located, which means that the position of the first circuit board can be adjusted in a larger range, thereby facilitating positioning and connective assembly of the first connector 5 and the second connector 5'.

In some embodiments, the elastic component 3 includes a first elastic member 302*a*. A first baffle 304*a* is further provided between the first elastic member 302*a* and the first circuit board. The first baffle 304*a* has a length in a third direction greater than a corresponding first hole 201. The first baffle 304*a* is provided with a third hole having an aperture diameter smaller than the first hole. The third direction is parallel to a plane where the mounting surface is located (the third direction may be any direction parallel to the plane where the mounting surface is located).

By providing the first baffle 304*a*, a sectional area of the first elastic member 302*a* parallel to the mounting surface can be smaller than a sectional area of the first hole 201 parallel to the mounting surface (but larger than a sectional area of the third hole parallel to the mounting surface), thereby facilitating miniaturization of the first elastic member 302*a*.

In some embodiments, the elastic component 3 includes a second elastic member 303*a*. A second baffle 305*a* is further provided between the second elastic member 303*a* and the first circuit board. The second baffle 305*a* has a length in a third direction greater than a corresponding first hole. The second baffle 305*a* is provided with a fourth hole having an aperture diameter smaller than the first hole.

By providing the second baffle 305*a*, a sectional area of the first elastic member 302*a* parallel to the mounting surface can be smaller than a sectional area of the first hole parallel to the mounting surface (but larger than a sectional area of the fourth hole parallel to the mounting surface), thereby facilitating miniaturization of the second elastic member 303*a*.

In some embodiments, sections of the first/second baffles 304*a*, 305*a* parallel to the mounting surface may each have an annular structure.

In some embodiments, the elastic component 3 includes a first elastic member 302*a* nested onto a periphery of the first connection member. Additionally/Alternatively, the elastic component 3 includes a second elastic member 303*a* nested onto the periphery of the first connection member.

In some embodiments, the first elastic member 302*a* includes a spring (shown in FIG. 3) or a spring leaf (not shown); and the second elastic member 303*a* includes a spring (shown in FIG. 3) or a spring leaf (not shown). In some embodiments, the spring used as the first elastic member 302*a* or the second elastic member 303*a* may be a cylindrical coil spring that can bear both tension and compression; and the first connection member 301*a*_2 of the location limited component 301*a* may pass through a hollow channel of the cylindrical coil spring to be connected to the second hole 401.

With continued reference to FIGS. 2 and 3, in some embodiments, the second hole 401 is a screw hole. The location limited component 301*a* is a screw. The location limited member 301*a*_1 is a screw nut. The first connection member 301*a*_2 is a screw bolt. External threads on the first connection member are matched with internal threads in the second hole 401. In other words, in the present disclosure, the location limited component and the mounting surface of the bottom plate 4 may be fixed in a screwing manner, thereby facilitating assembly and disassembly of the sub-display panel assembly.

In some embodiments, a section of the first circuit board body 2 parallel to the mounting surface has a substantially quadrilateral contour, and four first holes 201 are provided and arranged at four corner positions of the first circuit board body 2, respectively.

Apparently, other numbers of first holes, such as one, two, three, or even more first holes, may be provided in the embodiments of the present disclosure. The first holes may be provided at other positions on the first circuit board body 2, such as on a side edge of the first circuit board body 2, in a central region of the first circuit board body 2, or the like. The number, positions, and arrangement of first holes are not limited in the technical solution of the present disclosure.

Figure 5:
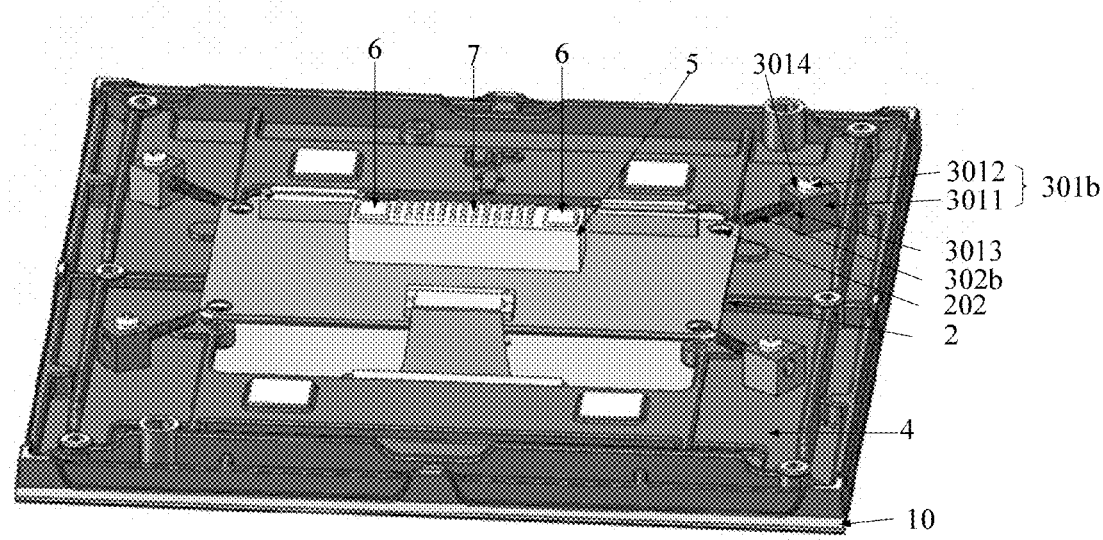
FIG. 5 is another schematic structural view of a sub-display panel assembly according to an embodiment of the present disclosure.
Figure 6:
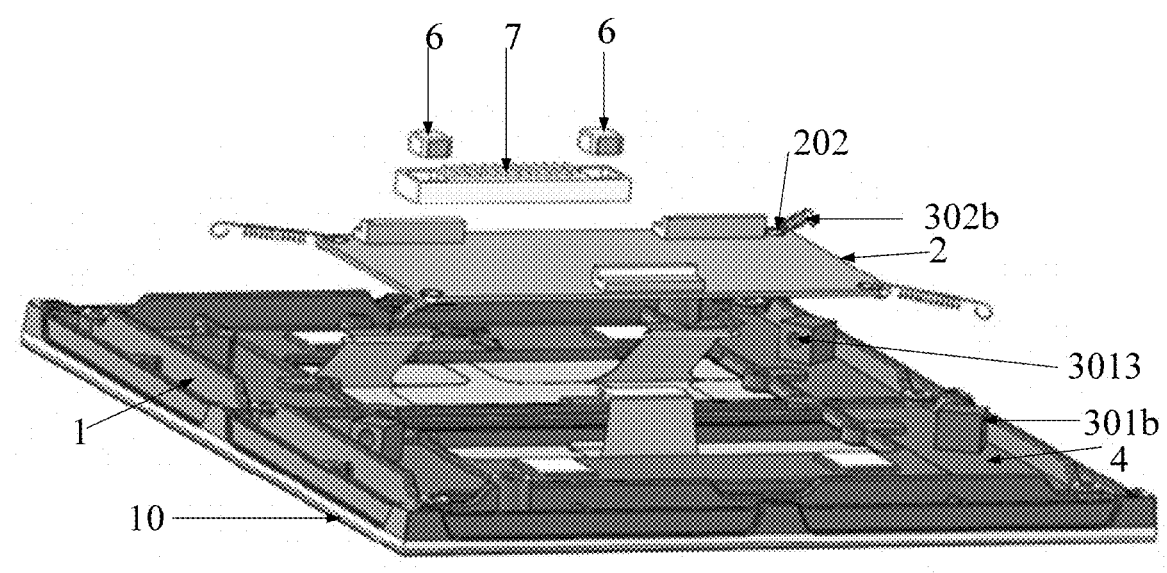
FIG. 6 is an exploded structural view of the sub-display panel assembly shown in FIG. 5.

FIG. 5 is another schematic structural view of a sub-display panel assembly according to an embodiment of the present disclosure. FIG. 6 is an exploded structural view of the sub-display panel assembly shown in FIG. 5. As shown in FIGS. 5 and 6, different from the technical solution in which the elastic component 3 includes a location limited component in the previous embodiment, in the case shown in FIG. 5, the first circuit board body 2 is provided with a plurality of fifth holes 202 in one-to-one correspondence with the elastic component 3. The elastic component 3 includes: a fixed component 301*b* and a third elastic member 302*b*. The fixed component 301*b* is fixed on the mounting surface, one end of the third elastic member 302*b* is fixedly connected to a corresponding fifth hole 202, and the other end of the third elastic member 302*b* is connected to the fixed component 301*b*.

In the case shown in FIG. 5, the position of the first circuit board can be adjusted not only in the normal direction of the display substrate 10, but also in the direction parallel to the plane where the display substrate 10 is located, which means that the position of the first circuit board can be adjusted in a larger range, thereby facilitating positioning and connective assembly of the first connector 5 and the second connector 5'.

In some embodiments, the fixed component 301*b* includes: a fixed member 3011 and a second connection member 3012. The fixed member 3011 is provided with a sixth hole 3013 and a seventh hole 3014. The seventh hole 3014 is communicated to the sixth hole 3013 from one surface of the fixed member 3011. An extending direction of the seventh hole 3014 is intersected with an extending direction of the sixth hole 3013. The second connection member 3012 extends into the sixth hole 3013 through the seventh hole 3014 to be connected to the fixed member 3011. One end of the third elastic member 302*b*, which is away from the first circuit board body 2, extends into the sixth hole 3013 to be connected to the second connection member 3012.

In some embodiments, the seventh hole 3014 is a screw hole, the second connection member 3012 is a screw, and internal threads in the seventh hole 3014 are matched with external threads on the second connection member 3012. Through the above design, assembly and disassembly of the sub-display panel assembly are facilitated.

In some embodiments, the fixed member 3011 is integrally formed with the bottom plate 4. In other words, the fixed member 3011 and the bottom plate 4 may be prepared at the same time through the same process, and form an integral structure. In some embodiments, the frame 1 is an aluminum frame, and the fixed member 3011 is an aluminum block.

In some embodiments, a section of the first circuit board body 2 parallel to the mounting surface has a substantially quadrilateral contour, and four fifth holes 202 are provided and arranged at four corner positions of the first circuit board body 2, respectively.

Apparently, other numbers of fifth holes 202, such as one, two, three, or even more fifth holes, may be provided in the embodiments of the present disclosure. The fifth holes 202 may be provided at other positions on the first circuit board body 2, such as on a side edge of the first circuit board body 2, in a central region of the first circuit board body 2, or the like. The number, positions, and arrangement of fifth holes 202 are not limited in the technical solution of the present disclosure.

In some embodiments, the third elastic member 302*b* includes a spring. In some embodiments, the spring used as the third elastic member 302*b* may be a cylindrical coil spring. The cylindrical spiral spring has a simple structure and is easy to manufacture.

Figure 7:
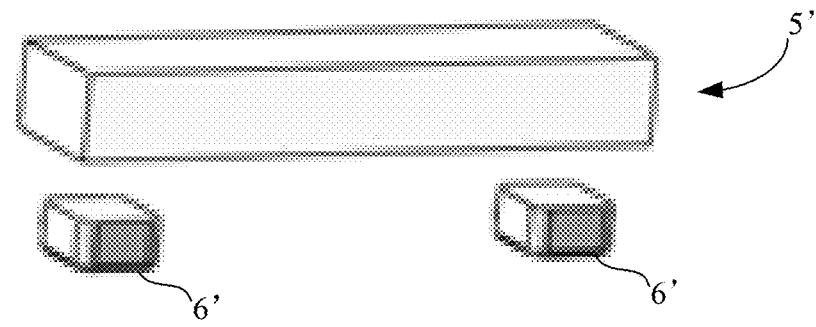
FIG. 7 is an exploded structural view of a first connector on a first circuit board and a second connector on a second circuit board according to an embodiment of the present disclosure.
Figure 7:
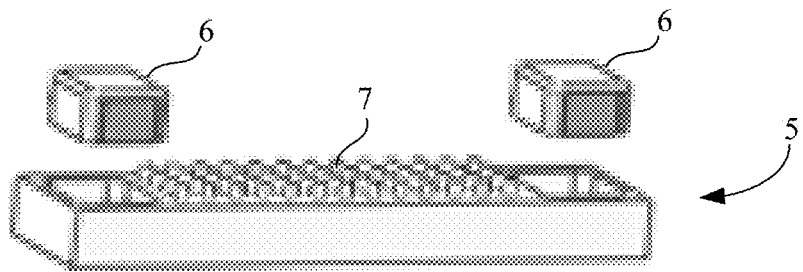
Figure 8:
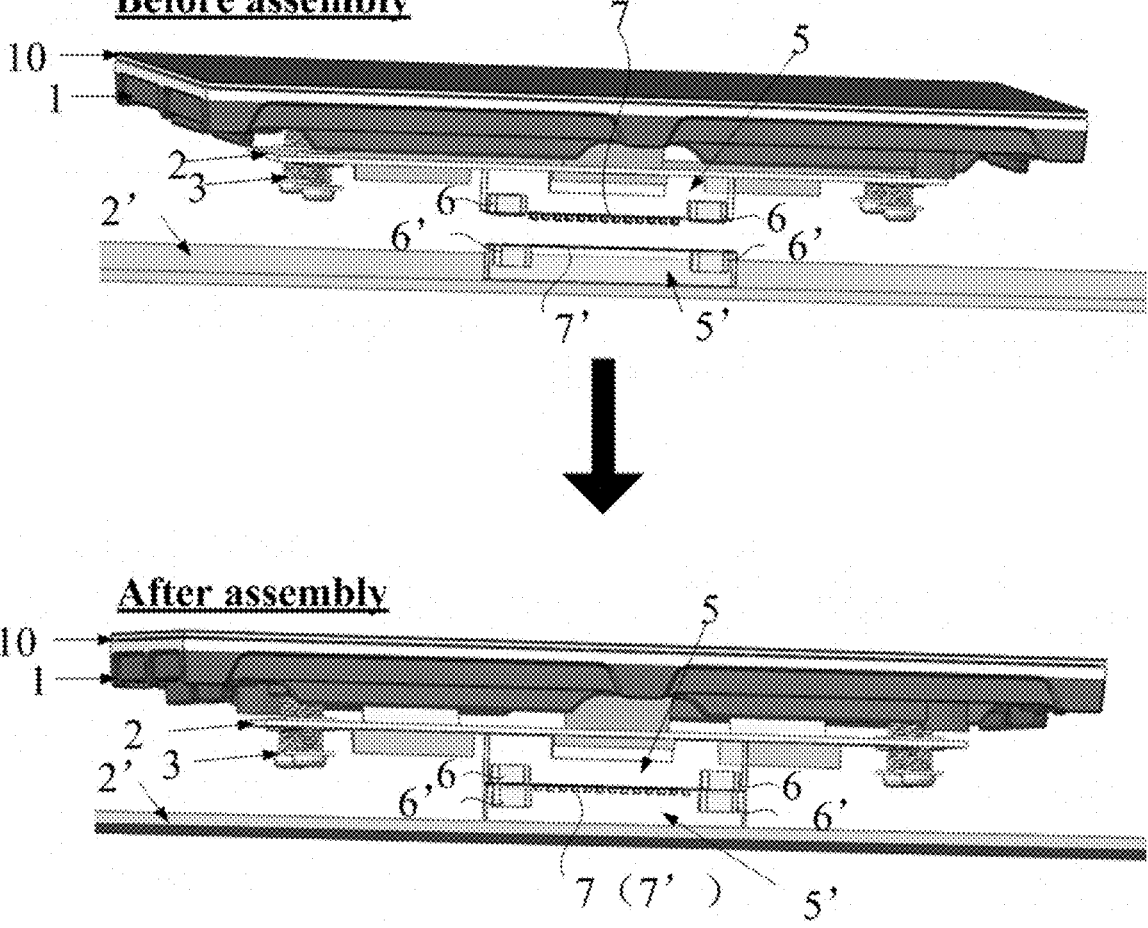
FIG. 8 is a schematic structural view of a first circuit board on the sub-display panel shown in FIG. 2 assembled with a second circuit board on a bearing box.
Figure 9:
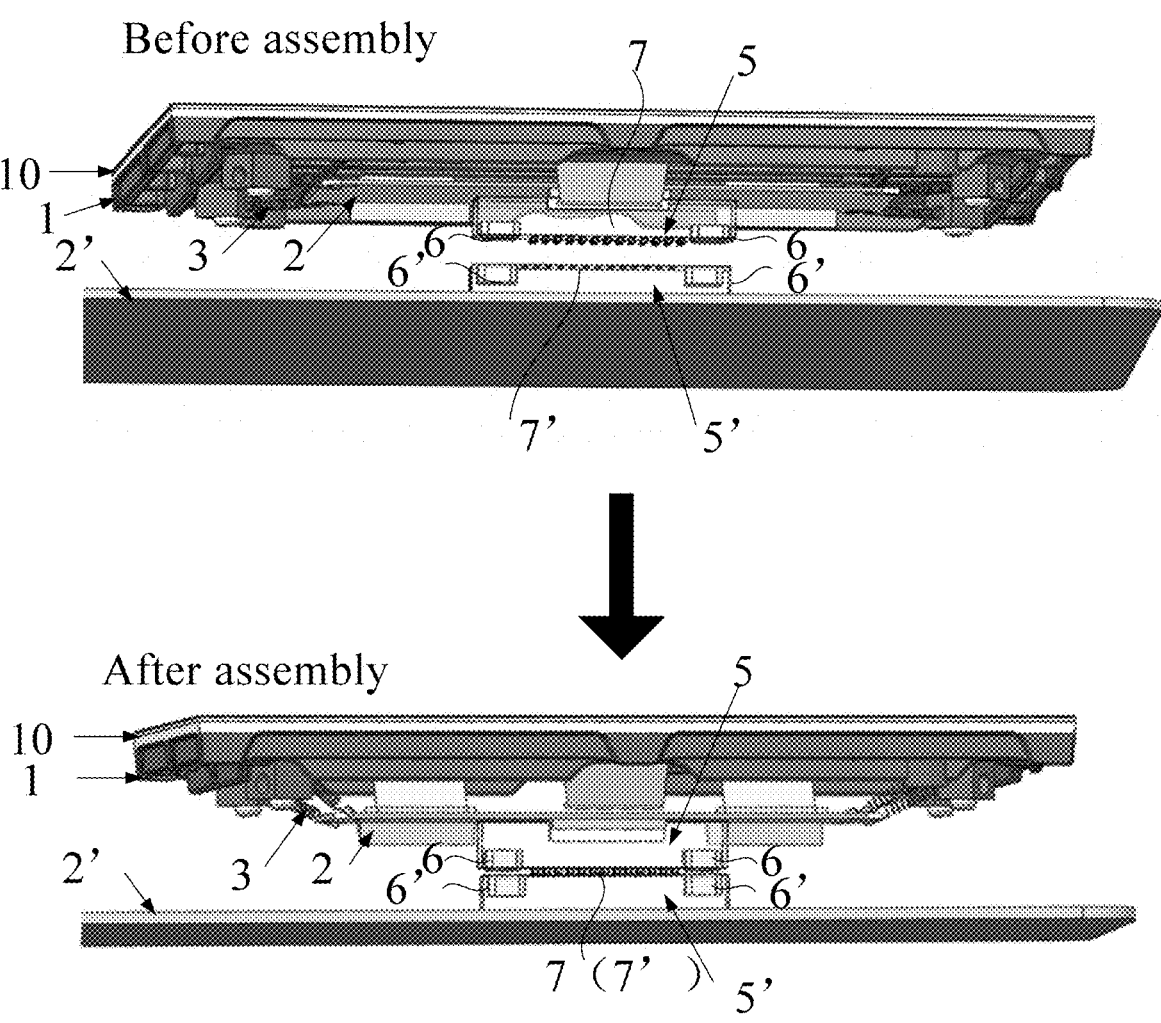
FIG. 9 is a schematic structural view of a first circuit board on the sub-display panel shown in FIG. 5 assembled with a second circuit board on a bearing box.

FIG. 7 is an exploded structural view of a first connector on a first circuit board and a second connector on a second circuit board according to an embodiment of the present disclosure. FIG. 8 is a schematic structural view of a first circuit board on the sub-display panel shown in FIG. 2 assembled with a second circuit board on a bearing box. FIG. 9 is a schematic structural view of a first circuit board on the sub-display panel shown in FIG. 5 assembled with a second circuit board on a bearing box. As shown in FIGS. 1 to 3 and 5 to 9, in some embodiments, the first circuit board further includes: a first connector 5 on the mounting surface. The first connector 5 is configured to be fixedly assembled with a second connector 5' of a second circuit board 2' on a bearing box. A first connection terminal 7 and a first magnetic attraction structure 6 are provided on a side surface of the first connector 5 away from the mounting surface, and a second connection terminal 7' and a second magnetic attraction structure 6' are provided on the second connector 5'. The first connector 5 and the second connector 5' are configured to: be magnetically attracted through the first magnetic attraction structure 6 and the second magnetic attraction structure 6', so that the first connection terminal 7 contacts the second connection terminal 7'. It will be appreciated that the first connector 5 and the second connector 5' are male and female with respect to each other.

Different from the traditional manner in which the first connector 5 and the second connector 5' are positioned and fixedly assembled through a positioning column and a positioning hole, the embodiment of the present disclosure provides the first magnetic attraction structure 6 and the second magnetic attraction structure 6', so that under the condition that the first circuit board can be moved relative to the bottom plate 4, the first connector 5 in the sub-display panel assembly and the second connector 5' on the bearing box can be aligned and connectively assembled automatically in a magnetic attraction manner when the sub-display panel assembly is assembled onto the bearing box, thereby greatly improving the assembly efficiency.

In addition, when the first connector 5 and the second connector 5' are completely and connectively assembled, the elastic component 3 may be further used to control the frame 1 (with the display substrate 10) to move relative to the first circuit board, so that a position of the frame 1 in each sub-display panel assembly on the bearing box can be adjusted, thereby implementing adjustment of tiling seams and segment differences between the sub-display panel assemblies.

In some embodiments, a plurality of first connection terminals 7 are provided on a side surface of the first connector 5 away from the mounting surface and form a first connection terminal 7 array. Two first magnetic attraction structures 6 are provided and arranged on opposite sides of the first connection terminal 7 array, respectively. By providing the two first magnetic attraction structures 6, the alignment precision and assembly firmness during the magnetic attraction process are increased.

In some embodiments, the first magnetic attraction structure 6 and the second magnetic attraction structure 6' are both magnets.

Referring again to FIG. 1, in some embodiments, the first circuit board further includes: a plurality of third connectors 8*a*, 8*b*, 8*c* on the mounting surface and connected to a circuit board in the display substrate 10 through flexible circuit boards FPC1 to FPC3.

Figure 10:
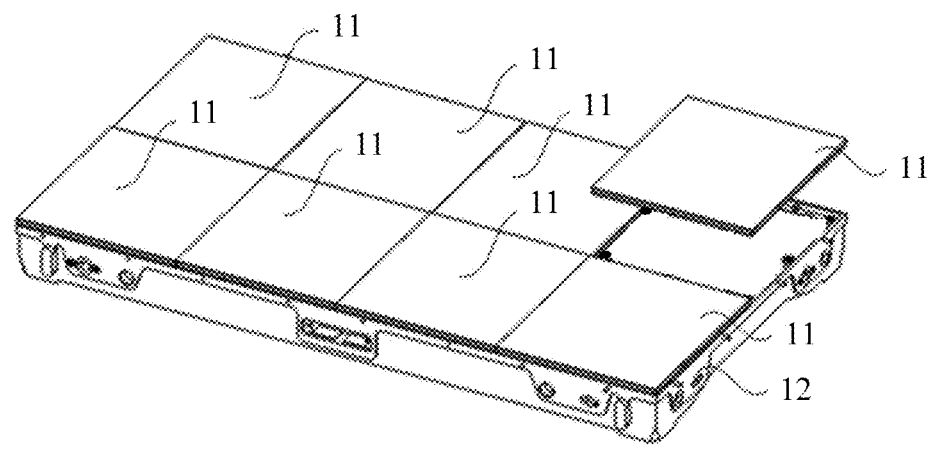
FIG. 10 is a schematic structural view of a tiled display apparatus according to an embodiment of the present disclosure.

FIG. 10 is a schematic structural view of a tiled display apparatus according to an embodiment of the present disclosure. As shown in FIG. 10, the tiled display apparatus includes: a plurality of sub-display panel assemblies 11, where at least one of the sub-display panel assemblies 11 is the sub-display panel assembly according to any of the above embodiments. For detailed description of the sub-display panel assembly 11, reference may be made to the contents in the foregoing embodiments, and details are not repeated here.

In some embodiments, the tiled display apparatus further includes: a bearing box 12. The bearing box 12 is configured to bear the plurality of the sub-display panel assemblies 11.

Referring again to FIGS. 1 to 9, in some embodiments, the first circuit board further includes: a first connector 5 on the mounting surface. A first connection terminal 7 and a first magnetic attraction structure 6 are provided on a side surface of the first connector 5 away from the mounting surface. The bearing box is provided with a plurality of second circuit boards 2' in one-to-one correspondence with the sub-display panel assemblies. A second connection terminal 7' and a second magnetic attraction structure 6' are provided on each second circuit board 2'. The first connector 5 and the second connector 5' are configured to: be magnetically attracted through the first magnetic attraction structure 6 and the second magnetic attraction structure 6', so that the first connection terminal 7 contacts a corresponding second connection terminal 7'.

In other words, while the sub-display panel assembly 11 is assembled onto the bearing box 12, the first connector 5 in the sub-display panel assembly 11 and the second connector 5' on the bearing box 12 can be aligned and connectively assembled automatically in a magnetic attraction manner, thereby greatly improving the assembly efficiency.

The embodiments of the present disclosure are as described above, where not all details of the embodiments are elaborated, and the present disclosure is not intended to be limited to these specific embodiments. Apparently, many modifications and variations are possible in light of the above description. The description has chosen and described these specific embodiments in detail for better illustration of the principles and practical applications of the present disclosure so that those skilled in the art can make good use of the present disclosure as well as modified applications based on the present disclosure. The present disclosure is intended to be limited only by the claims and the full scope and equivalents thereof.

What is claimed is:

1. A sub-display panel assembly, comprising:
   a display substrate;
   a frame, comprising a bottom plate, wherein the bottom plate has a support surface and a mounting surface arranged opposite to each other, wherein the support surface is configured to bear the display substrate; and
   a first circuit board on a side of the bottom plate away from of display substrate, the first circuit board comprises a first circuit board body, wherein the first circuit board body is connected to the mounting surface of the bottom plate through an elastic component, wherein the elastic component is configured to support the first circuit board body and enable the first circuit board body to move relative to the bottom plate;
   wherein the first circuit board body is provided with a plurality of fifth holes, the fifth hole is in one-to-one correspondence with the elastic component, and the elastic component comprises: a fixed component and a third elastic member; and the fixed component is fixed on the mounting surface, one end of the third elastic member is connected to a corresponding fifth hole, and the other end of the third elastic member is connected to the fixed component.

2. The sub-display panel assembly according to claim 1, wherein the first circuit board body is provided with at least one first hole, and the frame is provided with a corresponding second hole at a position opposite to the first hole;
   the elastic component is provided in one-to-one correspondence with the first hole, and the elastic component comprises: a location limited component, comprising a location limited member and a first connection member;
   the location limited member is located on a side of the first circuit board body away from the display substrate, and the location limited member has a length in a first direction greater than the first hole, wherein the first direction is parallel to a plane where the mounting surface is located;
   the first connection member passes through the first hole, one end of the first connection member is connected to the location limited member, and the other end of the first connection member extends into, and is connectively assembled with, the second hole;
   the elastic component further comprises: a first elastic member or a second elastic member, wherein the first elastic member is located between the location limited member and the first circuit board body, and the second elastic member is located between the bottom plate and the first circuit board body; and
   the first circuit board body is configured to be movable in a direction parallel to a normal direction of the bottom plate through the first elastic member or the second elastic member.

3. The sub-display panel assembly according to claim 2, wherein a sectional area of the first hole parallel to the display substrate is larger than a sectional area of a portion of the first connection member in the first hole parallel to the display substrate.

4. The sub-display panel assembly according to claim 3, wherein a first baffle is further provided between the first elastic member and the first circuit board, the first baffle has a length in a second direction greater than a corresponding first hole, and the first baffle is provided with a third hole having an aperture diameter smaller than the first hole;
   or a second baffle is further provided between the second elastic member and the first circuit board, the second baffle has a length in a second direction greater than a corresponding first hole, and the second baffle is provided with a fourth hole having an aperture diameter smaller than the first hole; and
   the second direction is parallel to the plane where the mounting surface is located.

5. The sub-display panel assembly according to claim 2, wherein the first elastic member is nested onto a periphery of the first connection member;
   or the second elastic member is nested onto the periphery of the first connection member.

6. The sub-display panel assembly according to claim 2, wherein the first elastic member comprises a spring or a spring leaf; and
   the second elastic member comprises a spring or a spring leaf.

7. The sub-display panel assembly according to claim 2, wherein the second hole is a screw hole, the location limited component is a screw, the location limited member is a screw nut, the first connection member is a screw bolt, and external threads on the first connection member are matched with internal threads in the second hole.

8. The sub-display panel assembly according to claim 2, wherein four first holes are provided and arranged at four corner positions of the first circuit board body, respectively.

9. The sub-display panel assembly according to claim 1, wherein the fixed component comprises: a fixed member and a second connection member;

the fixed member is provided with a sixth hole and a seventh hole, the seventh hole is communicated to the sixth hole from one surface of the fixed member, and an extending direction of the seventh hole is intersected with an extending direction of the sixth hole;

the second connection member extends into the sixth hole through the seventh hole to be connected to the fixed member; and one end of the third elastic member, which is away from the first circuit board body, extends into a corresponding sixth hole and connects to the second connection member.

10. The sub-display panel assembly according to claim 9, wherein the seventh hole is a screw hole, the second connection member is a screw, and internal threads in the seventh hole are matched with external threads on the second connection member.

11. The sub-display panel assembly according to claim 9, wherein the fixed member is integrally formed with the bottom plate.

12. The sub-display panel assembly according to claim 1, wherein four fifth holes are provided and arranged at four corner positions of the first circuit board body, respectively.

13. The sub-display panel assembly according to claim 1, wherein the third elastic member comprises a spring.

14. The sub-display panel assembly according to claim 1, wherein the first circuit board further comprises: a first connector on the mounting surface and configured to be assembled with a second connector on a bearing box;

a first connection terminal and a first magnetic attraction structure are provided on a side surface of the first connector away from the mounting surface, and a second connection terminal and a second magnetic attraction structure are provided on the second connector; and the first connector and the second connector are configured to: be magnetically attracted through the first magnetic attraction structure and the second magnetic attraction structure, so that the first connection terminal contacts the second connection terminal.

15. The sub-display panel assembly according to claim 14, wherein a plurality of first connection terminals are provided on a side surface of the first connector away from the mounting surface, and the plurality of first connection terminals form a first connection terminal array; and two first magnetic attraction structures are provided and arranged on opposite sides of the first connection terminal array, respectively.

16. The sub-display panel assembly according to claim 14, wherein the first circuit board further comprises: a plurality of third connectors on the mounting surface and connected to the display substrate through the flexible circuit board.

17. A tiled display apparatus, comprising: a plurality of sub-display panel assemblies, wherein at least one of the sub-display panel assemblies is the sub-display panel assembly according to claim 1.

18. The tiled display apparatus according to claim 17, further comprising:

a bearing box configured to bear the plurality of the sub-display panel assemblies.

19. The tiled display apparatus according to claim 18, wherein the first circuit board further comprises: a first connector on the mounting surface, wherein a first connection terminal and a first magnetic attraction structure are provided on a side surface of the first connector away from the mounting surface;

the bearing box is provided with a plurality of second circuit boards in one-to-one correspondence with the sub-display panel assemblies, and a second connection terminal and a second magnetic attraction structure are provided on each second circuit board; and the first connector and the second connector are configured to: be magnetically attracted through the first magnetic attraction structure and the second magnetic attraction structure, so that the first connection terminal contacts a corresponding second connection terminal.

20. The sub-display panel assembly according to claim 1, wherein the first circuit board body is provided with at least one first hole, and the frame is provided with a corresponding second hole at a position opposite to the first hole;

the elastic component is provided in one-to-one correspondence with the first hole, and the elastic component comprises: a location limited component, comprising a location limited member and a first connection member;

the location limited member is located on a side of the first circuit board body away from the display substrate, and the location limited member has a length in a first direction greater than the first hole, wherein the first direction is parallel to a plane where the mounting surface is located;

the first connection member passes through the first hole, one end of the first connection member is connected to the location limited member, and the other end of the first connection member extends into, and is connectively assembled with, the second hole;

the elastic component further comprises: a first elastic member and a second elastic member, wherein the first elastic member is located between the location limited member and the first circuit board body, and the second elastic member is located between the bottom plate and the first circuit board body; and the first circuit board body is configured to be movable in a direction parallel to a normal direction of the bottom plate through the first elastic member and the second elastic member.

\* \* \* \* \*